United States Patent
Esposito et al.

(10) Patent No.: US 7,269,617 B1
(45) Date of Patent: Sep. 11, 2007

(54) HYBRID MULTIPLIERS IMPLEMENTED USING DSP CIRCUITRY AND PROGRAMMABLE LOGIC CIRCUITRY

(75) Inventors: Benjamin Esposito, Oviedo, FL (US); Robert L Pelt, San Jose, CA (US)

(73) Assignee: Altera Corporation, San Jose, CA (US)

( * ) Notice: Subject to any disclaimer, the term of this patent is extended or adjusted under 35 U.S.C. 154(b) by 750 days.

(21) Appl. No.: 10/712,500

(22) Filed: Nov. 12, 2003

(51) Int. Cl.
*G06F 7/523* (2006.01)
(52) U.S. Cl. ....................................... 708/625
(58) Field of Classification Search ................ 708/625
See application file for complete search history.

(56) References Cited

U.S. PATENT DOCUMENTS 6,483,343 B1 * 11/2002 Faith et al. .................. 326/40
6,943,579 B1 * 9/2005 Hazanchuk et al. .......... 326/39
7,119,576 B1 * 10/2006 Langhammer et al. ........ 326/41
7,142,010 B2 * 11/2006 Langhammer et al. ........ 326/40

* cited by examiner

Primary Examiner—D. H. Malzahn
(74) Attorney, Agent, or Firm—Ropes & Gray LLP; Alexander Shvarts; Robert R. Jackson (57) ABSTRACT

A user logic design to hardware application is provided that efficiently implements in a PLD a user logic design multiplier using both programmable logic circuitry and one or more multipliers embedded in DSP circuitry integrated in the PLD. A smaller DSP multiplier may be used by implementing the user logic design multiplier in a sum of partial product arrangement in which one of the partial products is generated using the smaller DSP multiplier with the remaining partial products being generated by multipliers implemented using programmable logic circuitry.

14 Claims, 10 Drawing Sheets

HYBRID MULTIPLIERS IMPLEMENTED USING DSP CIRCUITRY AND PROGRAMMABLE LOGIC CIRCUITRY

BACKGROUND OF THE INVENTION

The present invention relates to programmable logic integrated circuitry devices and, more particularly, the present invention relates to hybrid multipliers implemented in programmable logic integrated circuitry devices having integrated DSP ("DSP") circuitry.

Programmable logic devices ("PLDs") are well known as shown in, for example, Jefferson et al. U.S. Pat. No. 6,215,326 and Ngai et al. U.S. Pat. No. 6,407,576. PLD technology is well known for its ability to allow one common hardware design (embodied in an integrated circuit) to be programmed to meet the needs of many different applications. PLDs with a given hardware design can be manufactured in large quantities at low cost. Each user then programs PLDs of that kind to meet that user's particular needs. The user does not have to do a custom integrated circuit design, with the attendant high cost, delay, and difficulty of revision if modifications are subsequently needed.

One of the problems facing users of PLDs is the limited logic capacity of any particular PLD. As applications become more complex, the logic resources and their interconnections in a PLD become limiting factors in the ability to implement particular designs in the PLD. This is at least partially attributable to the fact that a relatively large portion of programmable logic and interconnections are typically used to implement signal or data processing tasks (e.g., digital signal processing ("DSP") tasks) that would otherwise require comparatively few resources if implemented using DSP circuitry.

In an attempt to help alleviate this problem, recently, PLDs have been manufactured that include, in addition to programmable logic components, DSP components that implement common DSP tasks. Such common DSP tasks include, for example, multiplication. However, the multipliers implemented in the DSP circuitry of PLDs are not optimized for all types of multiplication tasks. For example, the multipliers embedded in the DSP circuitry of any particular PLD are limited to one or more particular sizes (e.g., 9 bits by 9 bits, 18 bits by 18 bits, 36 bits by 36 bits, etc.).

In order to multiply data having sizes that do not conform with one of the available sizes, present-day hardware compilers implement such a multiplication operation in a single multiplier that would be able to accommodate such a multiplication. This results in inefficient use of resources. For example, when compiling a 10 bits by 10 bits multiplication when only 9 bits by 9 bits multipliers and 18 bits by 18 bits multipliers are available, the 18 bits by 18 bits multiplier would be used, thus making inefficient use of a larger multiplier.

It would therefore be desirable to provide a more efficient implementation of multipliers embedded in the DSP circuitry that is integrated in PLDs.

SUMMARY OF THE INVENTION

It is therefore an object of this invention provide a more efficient implementation of multipliers in PLDs having integrated DSP circuitry.

A user logic design to hardware application is provided. The user logic design to hardware application compiles a user logic design into hardware constructs to be implemented in a PLD.

The user logic design to hardware application may determine, based on any suitable factors, that using a multiplier embedded in the DSP circuitry of a target PLD to implement a user logic design multiplier is inefficient (e.g., because the user logic design multiplier is relatively small compared to the size of the smallest available DSP multiplier that can implement the user logic design multiplier, resulting in a waste of DSP circuitry). However, implementation of the user logic design multiplier in solely programmable logic circuitry would result in a waste of too much programmable logic (i.e., given the complexity of implementing multipliers in programmable logic circuitry).

Based on this determination, the user logic design to hardware application may implement the user logic design multiplier as a hybrid multiplier making use of both DSP circuitry and of programmable logic circuitry. In one suitable embodiment of the present invention, the user logic design to hardware application may select that largest available DSP multiplier that is smaller than the size of the user logic design multiplier to use as one partial product in an sum of partial product expansion.

More particularly, the user logic design to hardware application may implement a user logic design multiplier by decomposing the user logic design multiplier into component multipliers. Each component multiplier generates a partial product. The sum of all of the partial products generated by the component multipliers of a user logic design multiplier is at least substantially equivalent to the product generated by the user logic design multiplier.

In one suitable approach, the user logic design to hardware application implements at least one of the component multipliers using the largest DSP multiplier that is still smaller than the size of the user logic design multiplier. The remaining component multipliers are implemented using programmable logic circuitry. The component multipliers are arranged in a circuit that suitably generates the sum of the partial products generated by the component multipliers. For example, the input data of the user logic design multiplier is partitioned and separated into appropriate strings of bits for use as inputs into the component multipliers. Appropriate shifting and padding of the products of the component multipliers may be implemented using any suitable arrangement of circuitry. An adder may be used to combine the partial products in order to generate the sum of partial products (i.e., the products of the user logic design multiplier).

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Regions in a programmable logic device ("PLD") may be dedicated to digital signal processing ("DSP") circuitry. Circuitry for providing DSP operations may be concentrated in a region in a PLD (e.g., concentrated only in that region). A plurality of such regions may be arranged in a PLD. DSP circuitry may be provided to perform multistage DSP operations. The organization of the DSP circuitry may make that circuitry open for use in many commonly used DSP operations. A desired DSP operation of interest may be selected from a particular set of DSP operations that the DSP region is configured to perform. A PLD with DSP regions may have other resources (e.g., programmable logic regions, memory, etc.) that are integrated with the DSP regions for high speed, low latency, or quick implementation of applications that are currently in high demand, such as video image processing, digital communications signal processing, or other applications that involve a combination of logic operations and DSP operations for suitable operation.

A PLD may have an architecture that is based on concentrating circuitry in different regions based on purpose. For example, with reference to FIG. 1, PLD 10 may include programmable logic circuitry 20 (e.g., programmable logic circuitry 20 that is concentrated in block-shaped regions in PLD 10), memory circuitry 30 (e.g., memory circuitry 30 that is concentrated in block-shaped regions in PLD 10), DSP circuitry 50 (e.g., DSP circuitry 50 that is concentrated in block-shaped regions in PLD 10), and distributed interconnect circuitry 40.

Figure 1:
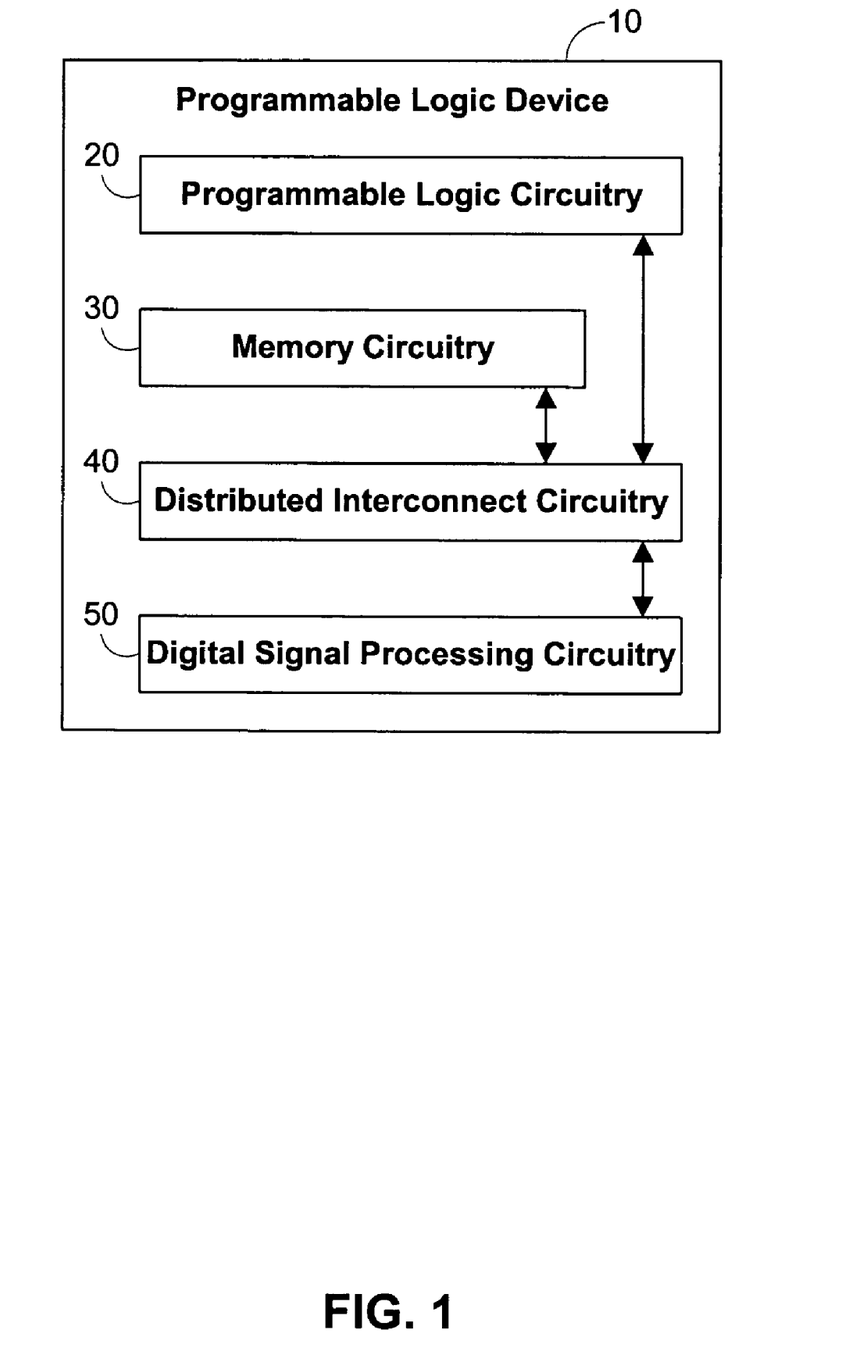
FIG. 1 is a block diagram of an illustrative PLD having DSP circuitry in accordance with one embodiment of the present invention.

Distributed interconnect circuitry 40 may be distributed over PLD 10 to provide connectivity between programmable logic circuitry 20, memory circuitry 30, and DSP circuitry 50. Programmable logic circuitry 20, memory circuitry 30, and DSP circuitry 50 may include local interconnect resources for forming interconnections between local resources. DSP circuitry 50 may be substantially mutually exclusive of circuitry, layout, functionality, or any combination thereof of programmable logic circuitry 20, memory circuitry 30, distributed interconnect circuitry 40, or any combination thereof.

DSP circuitry 50 may be a medium through which PLD 10 processes certain types of digital signals to achieve suitable operating speeds without substantially impairing or using other resources of PLD 10. DSP circuitry 50 may have capabilities that complement the capabilities of programmable logic circuitry 20. The complementary capabilities may sustain substantially concurrent use of substantially all of programmable logic circuitry 20 and DSP circuitry 50. If desired, DSP circuitry 50 may operate without relying on distributed interconnect circuitry 40 for performing internal DSP operations. Thus, DSP circuitry 50 may operate as a high speed isolated DSP channel.

Figure 2:
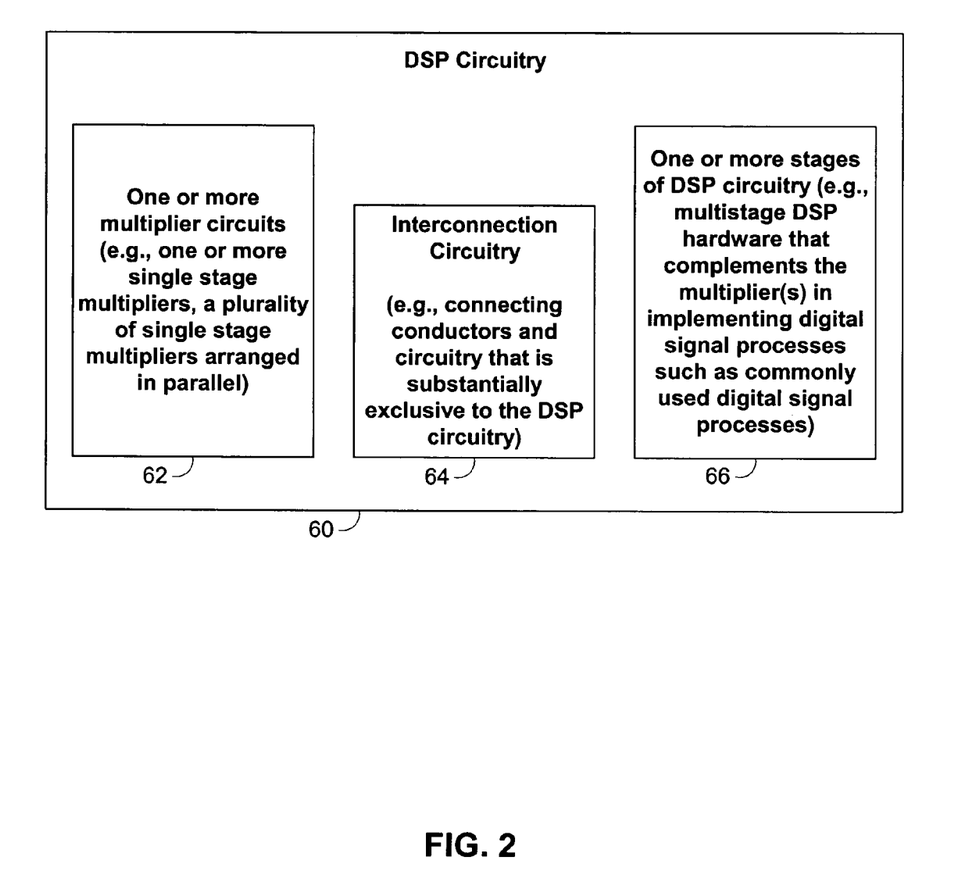
FIG. 2 is a block diagram of the illustrative DSP circuitry of FIG. 1 in accordance with one embodiment of the present invention.

DSP circuitry 50 may include multipliers and other DSP circuitry. For example, DSP circuitry 50 may include DSP circuitry 60 of FIG. 2. With reference now to FIG. 2, DSP circuitry 60 may include one or more multiplier circuits 62, interconnection circuitry 64, and one or more DSP stages 66.

Multiplier circuits 62 may include a plurality of individual multiplier circuits, a plurality of multipliers operable in parallel to provide a first DSP stage, four parallel n bits by n bits multipliers that are each configurable to be m parallel n/m bits by n/m bits multipliers where n/m is an integer, or any other suitable form of multipliers. DSP stage(s) 66 may include single stage or multistage DSP circuitry. DSP stage 66 may include adder circuitry, subtractor circuitry, accumulator circuitry, or any combination thereof. DSP stage 66 and multiplier circuits 62 may include other related circuitry. Interconnection circuitry 64 may include connecting conductors and circuitry that interconnects DSP stage 66 with multiplier circuits 62. The interconnections may be flexible or dedicated. Interconnection circuitry 64 may include conductors and circuitry for connecting DSP circuitry 62 with other resources in a PLD. Interconnection circuitry 64 may be dedicated to supporting operations in DSP circuitry 60.

DSP circuitry 60 is illustrative of the content and organization of a single DSP circuit block. Together, multiplier circuits 62 and DSP stage 66 may include a combination of processing elements that are common to a number of often used DSP operations such as infinite impulse response ("IIR") filters, direct form I finite impulse response ("FIR") filters, direct form II FIR filters, multiply accumulate operations, or any other suitable DSP operations.

A more detailed discussion of the structure of a PLD having integrated DSP circuitry is found in commonly-assigned Langhammer et al. U.S. Pat. No. 6,538,470, which is hereby incorporated by reference herein in its entirety.

It will be understood that the foregoing description of a structure of a PLD having integrated DSP circuitry is merely illustrative. The present invention may be practiced with respect to any other suitable PLD structure having integrated DSP circuitry. The present invention may, in fact, be practiced with a PLD coupled to external DSP circuitry. For purposes of clarity and brevity, the present invention is described herein in terms of a PLD having integrated DSP circuitry.

The present invention is described herein primarily in terms of a user logic design to hardware application that compiles a user logic design into hardware (i.e., contained in a PLD). It will be understood that the features of the present invention may be practiced through other ways. For example, the features of the present invention may be practiced without the aid of an application by allowing the user to manually implement design components into PLDs.

The user logic design to hardware application may include any suitable hardware, software, or both that is used to compile a user logic design into hardware constructs to be implemented in a PLD. The user logic design to hardware application may automatically implement the components of a user logic in one or more PLDs.

It will be understood that the user logic design to hardware application may be configured to take into account user preferences with respect to how any particular implementation is to take place. For example, user preferences are taken into account when the user logic design to hardware application needs to make decisions with respect to how certain components are implemented, routed, or the like. The user logic design to hardware application may provide the user with the ability to review and change any implementation decisions made by the user logic design to hardware application during the compilation process. The user logic design to hardware application may take into account other factors, such as the target PLD type (e.g., including, for example, the type of integrated DSP circuitry, amount of programmable logic, types of interconnections, any other suitable information about the target PLD, or any combination thereof), information about the circuit being implemented (e.g., types of components in the user logic design, number of particular components in the user logic design, application for which the user logic design has been created (e.g., video processing, network-related, or any other suitable application), size, any other suitable information about the circuit being created, or any combination thereof), any other suitable factors, or any combination thereof.

Because multipliers implemented in the DSP circuitry are optimized for certain sizes, user logic design multipliers of sizes that are different from these certain sizes do not efficiently map to what is available in the DSP circuitry. For example, in the Stratix™ family of field-programmable gate array products, manufactured by Altera® Corporation of San Jose, Calif., DSP circuitry integrated in the PLD contain multipliers optimized for sizes of 9 bits by 9 bits, 18 bits by 18 bits, and 36 bits by 36 bits. In order to implement a user logic design multiplier having a size of 10 bits by 10 bits, an 18 bits by 18 bits DSP multiplier would need to be used in which most of the capability of the DSP circuitry being used to implement the larger 18 bits by 18 bits multiplier is not being used.

Conventionally, when a user logic design multiplier exceeds one of the sizes supported by the DSP circuitry, the next highest sized DSP multiplier for which the DSP circuitry is optimized must be used. In a worst case scenario, if every multiplier of a user logic design exceeds the relative sizes for which the DSP circuitry of a PLD is optimized, most of the DSP circuitry used to implement the DSP multipliers will be wasted.

Because implementing multipliers using only programmable logic circuitry would result in large overly-complex implementations that use too many of the programmable logic circuitry resources, it would be preferable to implement hybrid multipliers in which both programmable logic circuitry and DSP circuitry are used. Hybrid multipliers are implemented by combining the DSP multipliers with additional multiplication being handled in programmable logic circuitry.

This may be accomplished by using the DSP multiplier of largest size for which the desired user logic design multiplier to be implemented is too large. The remaining multiplication may then be processed by programmable logic circuitry configured accordingly. For example, with reference to Altera®'s Stratix™ family of PLDs, a 9 bits by 9 bits DSP multiplier may be used together with programmable logic circuitry to implement a 10 bits by 10 bits user logic design multiplier.

In one embodiment of the present invention, the user logic design to hardware application may break down a user logic design multiplier into two or more other multipliers for implementation in hardware. For example, a user logic design multiplier that is slightly larger than one of the types of DSP multipliers embedded in the PLD but is significantly smaller than the next largest type of DSP multiplier embedded in the PLD, may be broken down into one or more multipliers that may be implemented in one or more of the DSP multipliers and into one or more multipliers that may be implemented using programmable logic circuitry.

Figure 3:
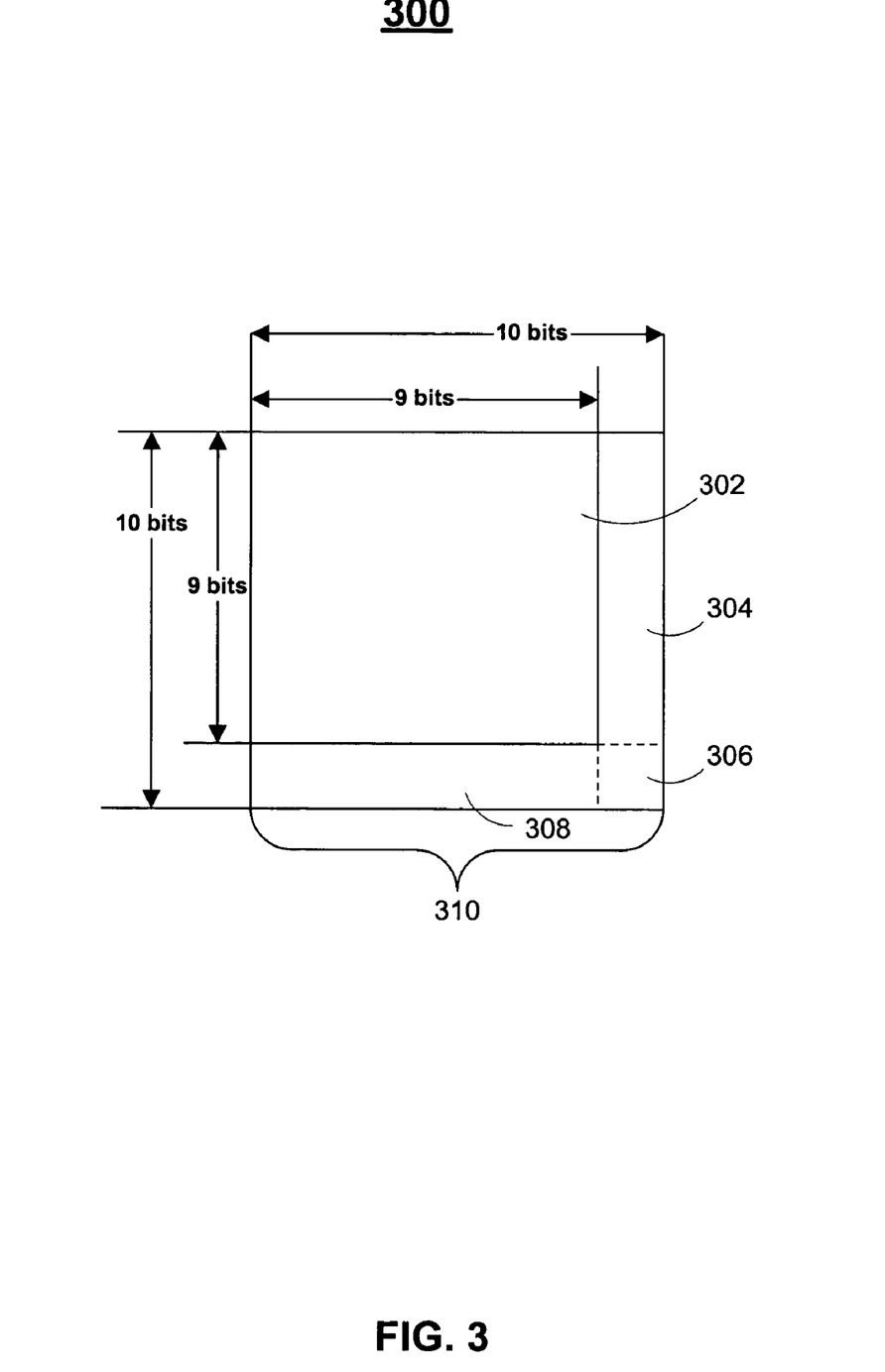
FIG. 3 is a representation of a user logic design multiplier decomposed into component multipliers used for obtaining partial products in accordance with one embodiment of the present invention.

In one suitable approach, this may be accomplished by decomposing the larger user logic design multiplier into component multipliers. The component multipliers may correspond to multipliers that produce partial products, the sum of which produces the product of the original larger user logic design multiplier. This decomposition is illustrated in FIG. 3, which shows an abstract representation of a user logic design multiplier 300. User logic design multiplier 300 is illustratively shown to be a 10 bits by 10 bits multiplier. If the target PLD has, for example, only 9 bits by 9 bits DSP multipliers and 18 bits by 18 bits DSP multipliers, it is understood that it would be more efficient to make use of one of the 9 bits by 9 bits DSP multipliers as opposed to one of the 18 bits by 18 bits DSP multipliers. As shown in FIG. 3, multiplier 300 may be decomposed such that one of the components of the decomposed multiplier is 9 bits by 9 bits multiplier 302 that may be efficiently implemented in one of the DSP multipliers of the target PLD. Multiplier 302 is illustrated, without loss of generality, as the upper left quadrant of multiplier 300. The remaining portions of multiplier 300 may be decomposed in any suitable way. For example, in one suitable approach, the remaining components may be decomposed to produce 1 bit by 9 bits multiplier 308, 1 bit by 1 bits multiplier 306, and 9 bits by 1 bit multiplier 304. The user logic design to hardware application may implement multipliers 304, 306, and 308 in programmable logic circuitry, whereas multiplier 302 is implemented in a 9 bits by 9 bits DSP multiplier.

It will be understood that any suitable decomposition of multiplier 300 may be made based on any suitable factors. For example, if the user logic design to hardware application determines that (e.g., because of available target resources) a sum of three partial products would be more efficient (as opposed to a sum of four partial products in the above example), the resultant implementation may include multiplier 302 implemented in a 9 bits by 9 bits DSP multiplier, 9 bits by 1 bit multiplier 304 implemented in programmable logic circuitry, and a 1 bit by 10 bits multiplier 310 implemented in programmable logic circuitry. Any other suitable decomposition may be used. For example, a 10 bits by 1 bit multiplier, a 1 bit by 9 bits multiplier, and a 9 bits by 9 bits multiplier may be used.

Figure 4:
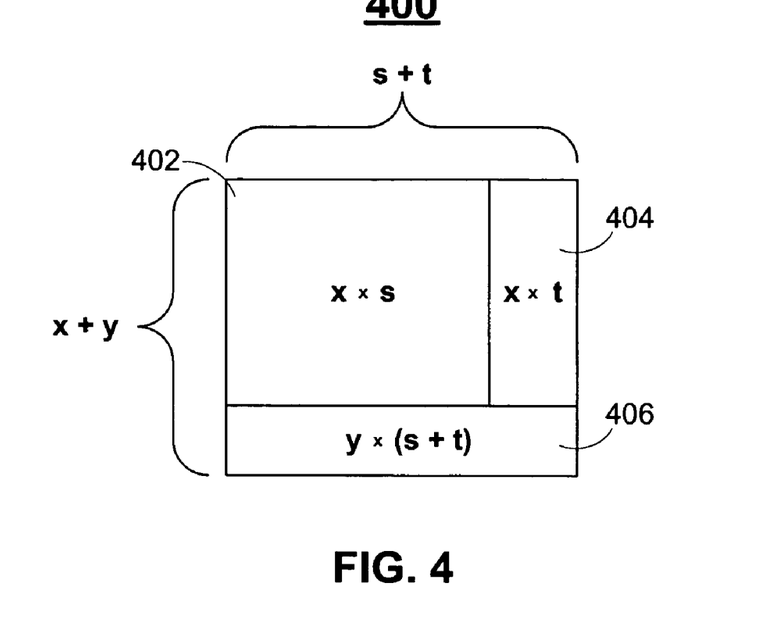
FIG. 4 is a generalized representation of a user logic design multiplier decomposed into three component multipliers used for obtaining partial products in accordance with one embodiment of the present invention.

FIG. 4 is a generalized diagram of a user logic design multiplier 400 having a size of (x+y) bits by (s+t) bits. The user logic design to hardware application may decompose multiplier 400 into, for example, three multipliers 402, 404, and 406 (i.e., that each generate partial products) where the target PLD has DSP multipliers optimized for x bits by s bits (i.e., the closest to, without being larger than, (x+y) bits by (s+t) bits). Multiplier 402 may, for example, be implemented in a x bits by s bits DSP multiplier. Multipliers 404 and 406 may be implemented using programmable logic circuitry.

Figure 5:
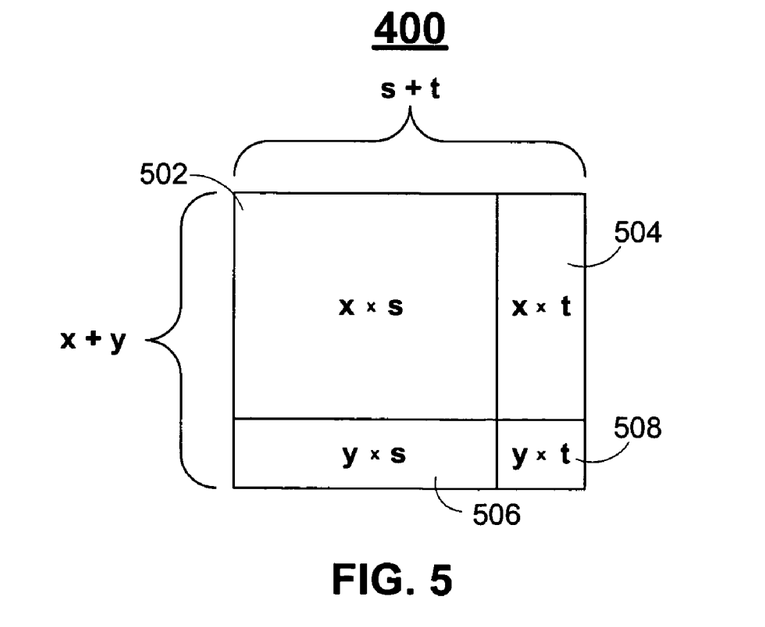
FIG. 5 is a generalized representation of a user logic design multiplier decomposed into four component multipliers used for obtaining partial products in accordance with one embodiment of the present invention.

It will be understood that the decomposition of multiplier 400 as shown in FIG. 4 is merely illustrative. Multiplier 400 may be decomposed into any suitable component multipliers for generating and suitable partial products based on any suitable factors, including, for example, user preferences. For example, FIG. 5 is a generalized diagram of multiplier 400 being decomposed into four component multipliers 502, 504, 506, and 508 (i.e., that generate partial products, the sum of which is the product of user logic design multiplier 400) where the target PLD has DSP multipliers optimized for x bits by s bits (i.e., the closest to, without being larger than, (x+y) bits by (s+t) bits) where x, y, s, and t represent positive integers. Multiplier 502 may, for example, be implemented in a x bits by s bits DSP multiplier. Multipliers 504, 506, and 508 may be implemented using programmable logic circuitry. Any such suitable decomposition may be made.

Figure 6:
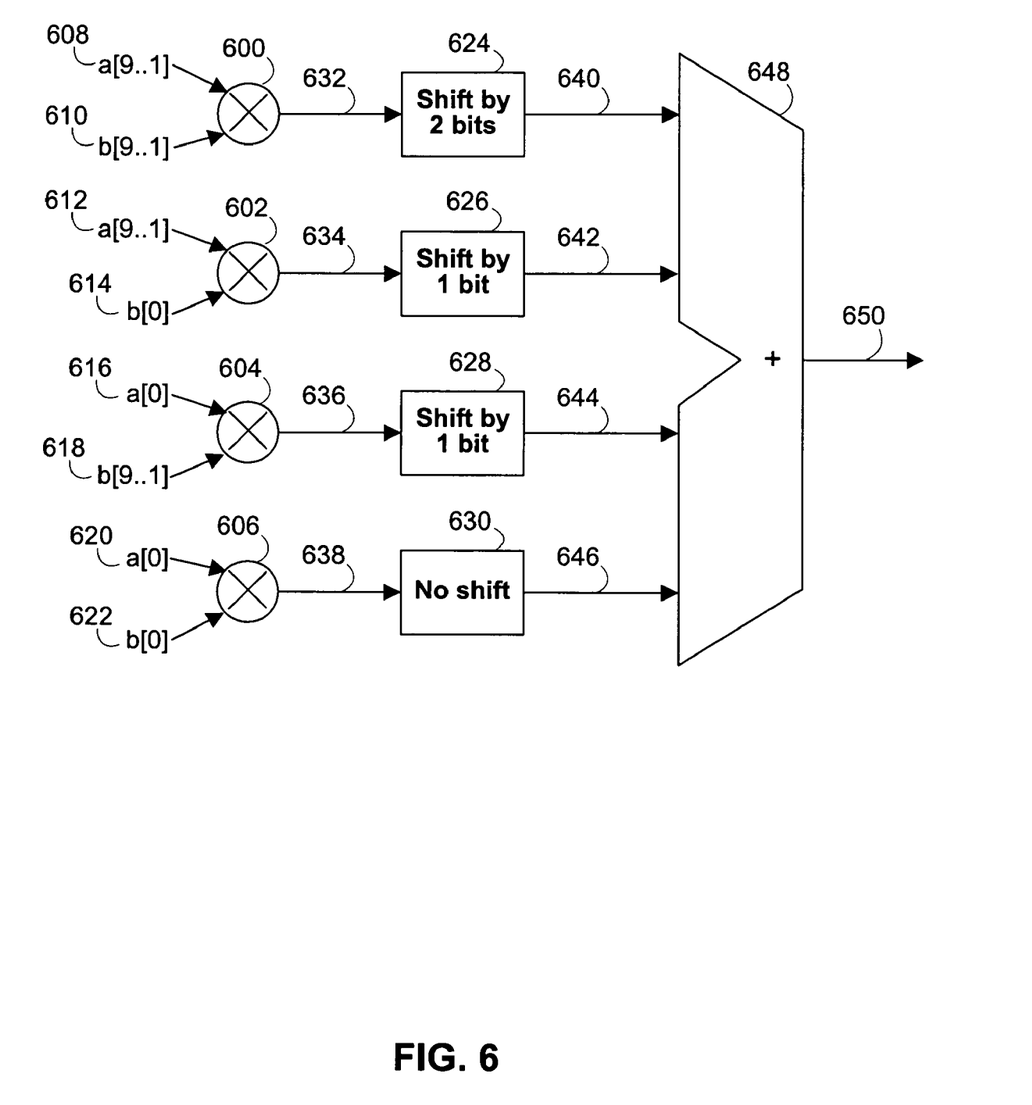
FIG. 6 is a schematic diagram of a particular implementation of a user logic design multiplier in accordance with one embodiment of the present invention.

FIG. 6 shows one implementation of a 10 bits by 10 bits user logic design multiplier as a hybrid multiplier in hardware. As illustrated in FIG. 6, multipliers 600, 602, 604, and 606 represent the component multipliers of the user logic design multiplier being implemented (e.g., corresponding to multipliers 502, 504, 506, and 508 of FIG. 5). Multiplier 600 is a 9 bits by 9 bits multiplier that may be implemented using a DSP multiplier. Multiplier 602 is a 9 bits by 1 bit multiplier implemented using programmable logic circuitry in the target PLD. Multiplier 604 is a 1 bit by 9 bits multiplier implemented using programmable logic circuitry in the target PLD. Multiplier 606 is a 1 bit by 1 bit multiplier implemented using programmable logic circuitry in the target PLD.

The user logic design to hardware application combines partial products using appropriate circuitry in order to implement the desired multiplier. Partial products 632, 634, 636, and 638 are generated from the multiplication of respective multiplicands 608, 612, 616, and 620 with respective multipliers 610, 614, 618, and 622. The bits of each partial product 632, 634, 636, and 638 are shifted and padded accordingly, as necessary, by respective circuitries 624, 626, 628, and 630. The resultant signals 640, 642, 644, and 646 are then added using, for example, adder 648 to produce sum of partial products 650 (i.e., the result of the original 10 bits by 10 bits user logic design multiplier).

Figure 7:
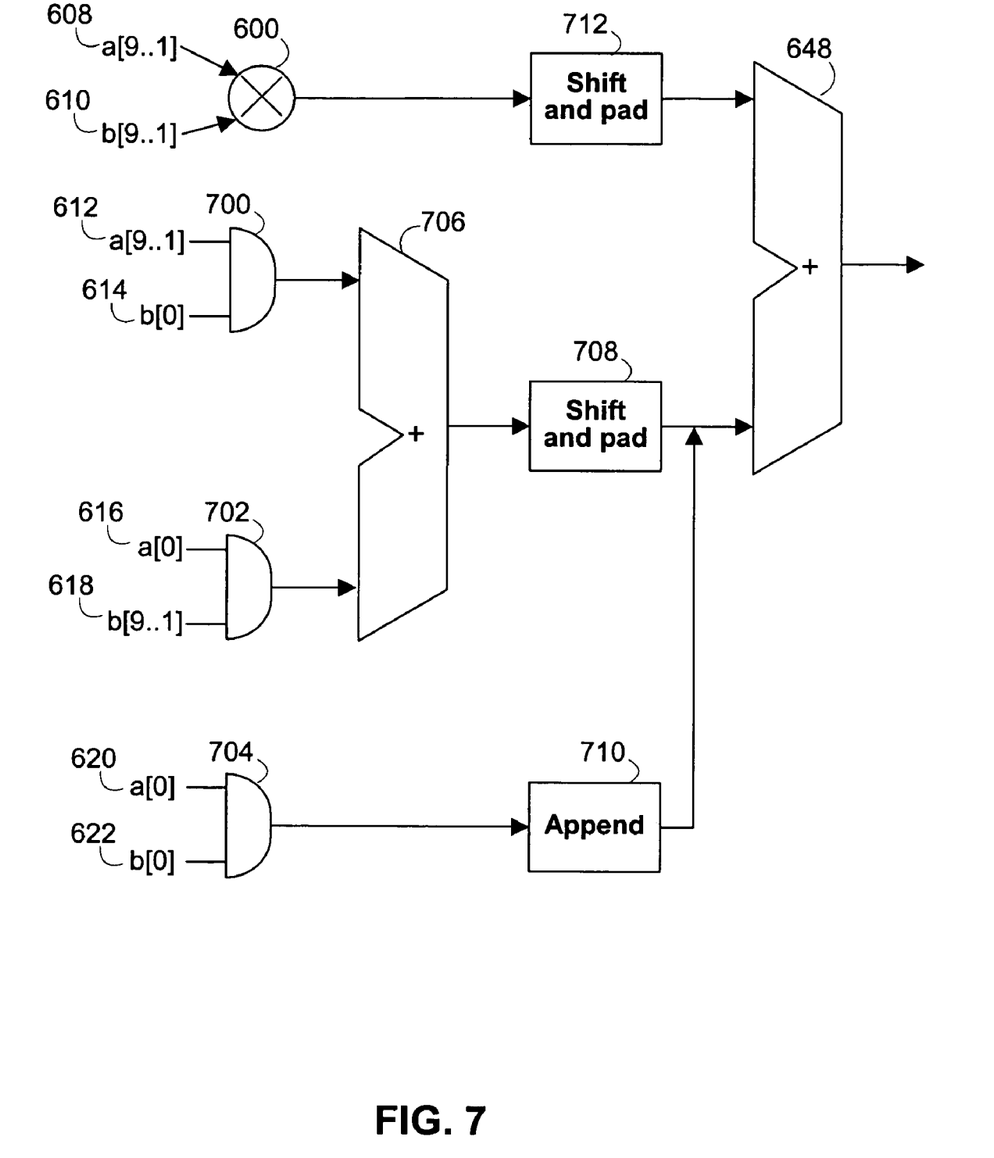
FIG. 7 is a more detailed schematic diagram of the particular implementation of the user logic design multiplier of FIG. 6 in accordance with one embodiment of the present invention.

FIG. 7 is a schematic diagram showing a more detailed implementation of the 10 bits by 10 bits user logic design multiplier of FIG. 6. For example, multipliers 602, 604, 606 that are implemented in programmable logic circuitry may be done so using AND gates 700, 702, and 704, respectively. The products of AND gates 700 and 702 may be combined using adder 706. The output of adder 706 is appended (i.e., using circuitry 710) with the product of AND gate 704 (i.e., after appropriate shifting and padding of bits using circuitry 708). That result is then combined with the product of multiplier 600 (i.e., the bits of which have been appropriately shifted and padded using circuitry 712) using adder 648.

FIGS. 6 and 7 are merely illustrative arrangements that may be used to implement a hybrid multiplier in accordance with the present invention. Any other suitable arrangements may be used. For example, different arrangements of components may be used for the sum of four partial products implementation. Also, it will be understood that although FIGS. 6 and 7 illustrate an implementation of a 10 bits by 10 bits multiplier using a sum of four partial products, any suitable such arrangement may be used in an implementation that uses the sum of any other suitable umber of partial products (e.g., three).

In one embodiment of the present invention, the user logic design to hardware application may be configured to consider the special case of when a user logic design multiplier exceeds the optimized sizes of DSP multipliers implemented in the target PLD by one bit on only one side of the multiplier. For example, if the user logic design requires that a 19 bits by 18 bits multiplier be implemented, and the target PLD has as the closest match 18 bits by 18 bits DSP multipliers, then the user logic design to hardware application may implement the user logic design multiplier in hardware as illustrated in FIG. 8.

Figure 8:
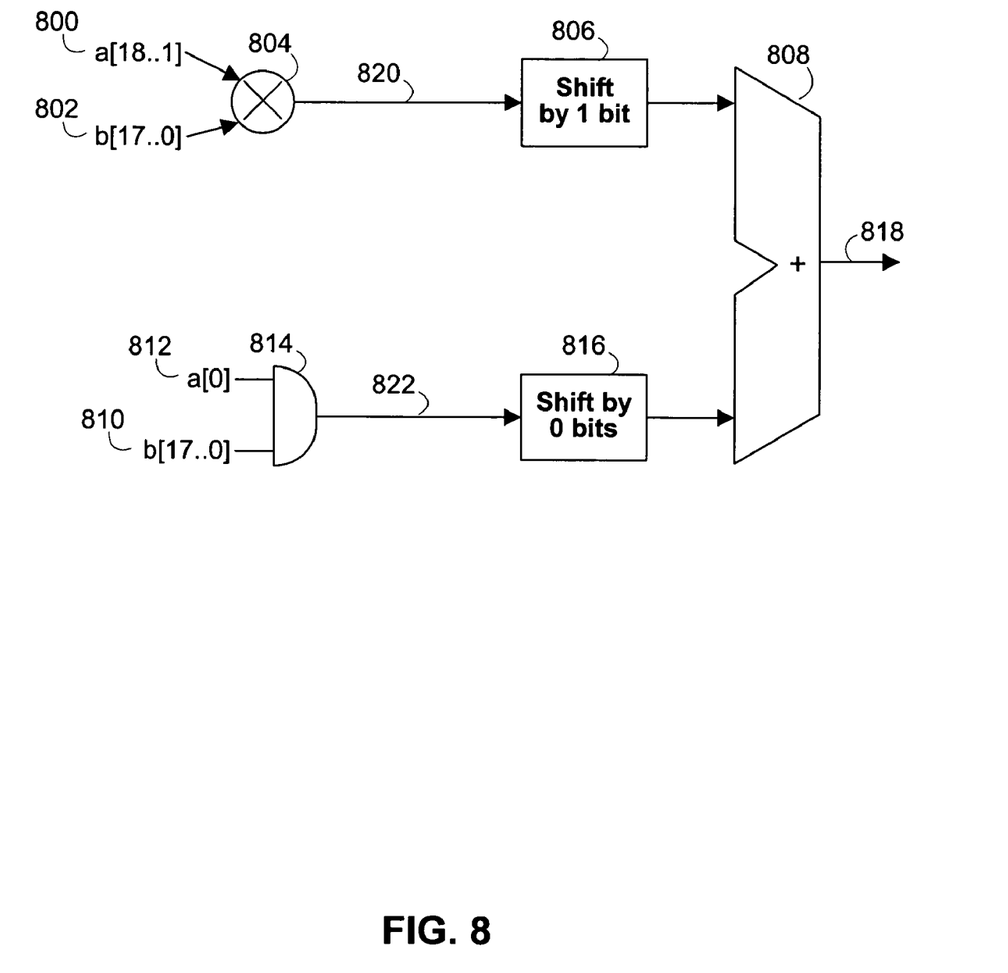
FIG. 8 is a schematic diagram of a particular special case implementation of a user logic design multiplier in accordance with one embodiment of the present invention.

The arrangement shown in FIG. 8 uses a sum of two partial products to implement a 19 bits by 18 bits user logic design multiplier in the target PLD. Multiplier 804 is an 18 bits by 18 bits DSP multiplier that multiplies 18 bit multiplicand 800 with 18 bit multiplier 802 to produce partial product 820. The second partial product (i.e., partial product 822) is generated by a 1 bit by 18 bits multiplier implemented using AND gate 814. 1 bit multiplicand 812 is multiplied by 18 bit multiplier 810 to produce partial product 822. The respective bits of partial products 820 and 822 are shifted and padded, as necessary, using appropriate circuitry 806 and 816. The partial products are combined using adder 808 to produce multiplier output 818.

FIG. 8 is merely an illustrative arrangement. Any other suitable arrangement may be used using any suitable design and combination of components in accordance with the present invention. For example, the user logic design to hardware application need not identify this particular special case of user logic design multiplier and may use an implementation such as that described with respect to FIGS. 7 and 8.

The implementation illustrated in FIG. 8 may be of particular applicability with respect to FIR filters. Symmetrical FIR filters typically require a single bit of growth on one of the inputs to the multiplier as a result of a pre-add operation. For example, if a symmetrical FIR filter requires 9 bit data and 9 bit coefficients, the pre-add associated with symmetry will then require 10 bits by 9 bits multipliers. Similarly, if a symmetrical FIR filter requires 18 bit data and 18 bit coefficients, 19 by 18 bits multipliers will be needed.

It will be understood that although the present invention is primarily described herein in terms of DSP multipliers being optimized for symmetric sizes (i.e., n bits by n bits), the present invention may be practiced for DSP multipliers optimized for asymmetrical sizes (i.e., n bits by m bits, where n≠m).

Figure 9:
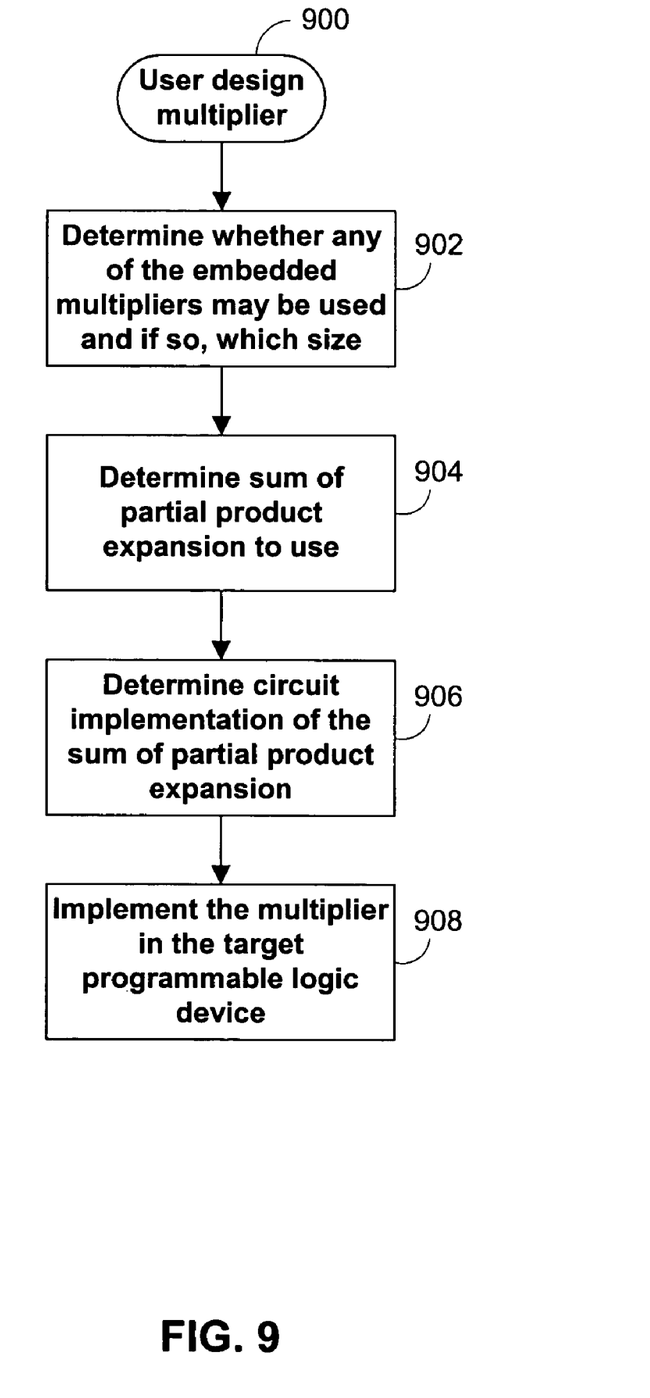
FIG. 9 is a flow-chart of illustrative steps involved in implementing user logic design multipliers as hybrid multipliers in a target PLD in accordance with one embodiment of the present invention.

FIG. 9 is a flow-chart of illustrative steps involved in implementing user logic design multipliers as hybrid multipliers in a target PLD in accordance with one embodiment of the present invention. The user logic design to hardware application examines a user logic design multiplier 900 and at step 902 determines whether any of the DSP multipliers in the target PLD may be used in the implementation of the user logic design multiplier. If such DSP multipliers do not exist (e.g., because all are already being used, those available are too small, or for any other suitable reason), then the user logic design multiplier may be implemented using, for example, solely programmable logic circuitry.

If, at step, 902 the user logic design to hardware application determines that there are available DSP multiplier resources available, then the user logic design to hardware application determines which of the available sizes to use. For example, in one suitable approach, the user logic design to hardware application may use an embedded multiplier having dimensions closest to that of the user logic design multiplier. In another suitable approach, the user logic design to hardware application may analyze any suitable efficiency factors associated with implementing a user logic design multiplier in either a larger DSP multiplier (i.e., not requiring a sum of partial product expansion implementation using the hybrid features of the present invention), or in a smaller DSP multiplier in accordance with the present invention. Such factors may involve comparing the value of using the larger multiplier to the savings in programmable logic that would be expended in implementing the user logic design multiplier in accordance with the combination of DSP circuitry and programmable logic circuitry arrangement in accordance with the present invention.

Assuming that an implementation that makes use of the combination of DSP circuitry and programmable logic circuitry is used, then at step 904, the user logic design to hardware application determines the particular sum of partial product expansion to use (e.g., based on the DSP multiplier or multipliers that will be used, size of the user logic design multiplier, amount of programmable logic circuitry to be used, speed of the resultant circuit, any other suitable factors, or any combination thereof).

At step 906, the user logic design to hardware application determines the circuit implementation of the sum of partial product expansion identified at step 904.

At step 908, the user logic design to hardware application implements the user logic design multiplier in the target PLD using the circuit implementation identified at step 906.

The flow-chart of FIG. 9 is merely illustrative. Any other suitable steps may be used in place of or in addition to any of those illustrated in accordance with the present invention. Any suitable steps may be removed from the flow-chart.

Figure 10:
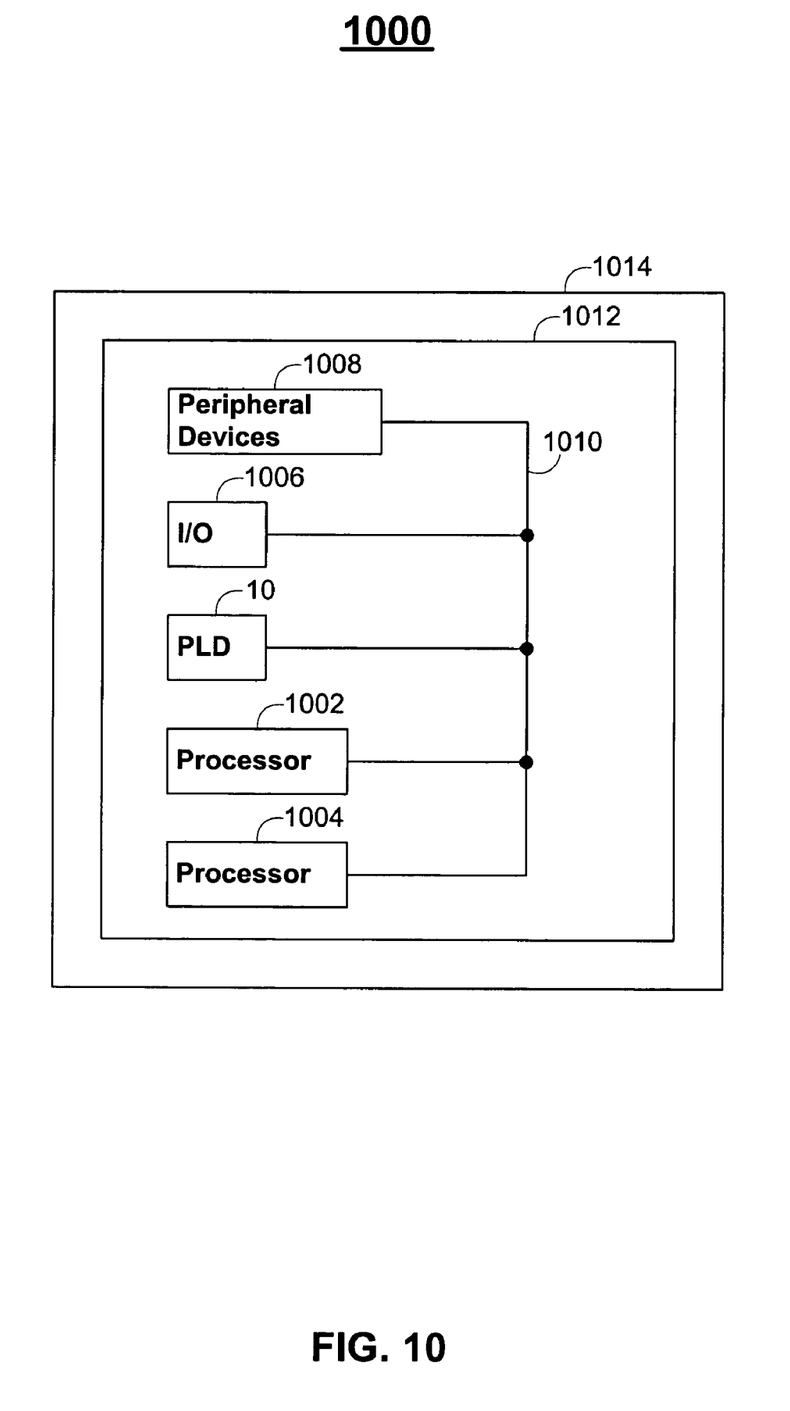
FIG. 10 is a simplified schematic diagram of an illustrative system employing a PLD in accordance with one embodiment of the present invention.

FIG. 10 illustrates a PLD 10 (FIG. 1) of this invention (i.e., having at least one hybrid multiplier implemented therein) in a data processing system 1000 in accordance with one embodiment of the present invention. Data processing system 1000 may include one or more of the following components: a processor 1002; memory 1004; I/O circuitry 1006; and peripheral devices 1008. These components are coupled together by a system bus 1010 and are populated on a circuit board 1012 which is contained in an end-user—system 1014.

System 1000 may be used in a wide variety of applications, such as computer networking, data networking, instrumentation, video processing, DSP, or any other application where the advantage of using programmable or reprogrammable logic is desirable. PLD 10 may be used to perform a variety of different logic functions. For example, PLD 10 may be configured as a processor or controller that works in cooperation with processor 1002. PLD 10 may also be used as an arbiter for arbitrating access to a shared resource in system 1000. In yet another example, PLD 10 may be configured as an interface between processor 1002 and one of the other components in system 1000.

Figure 11:
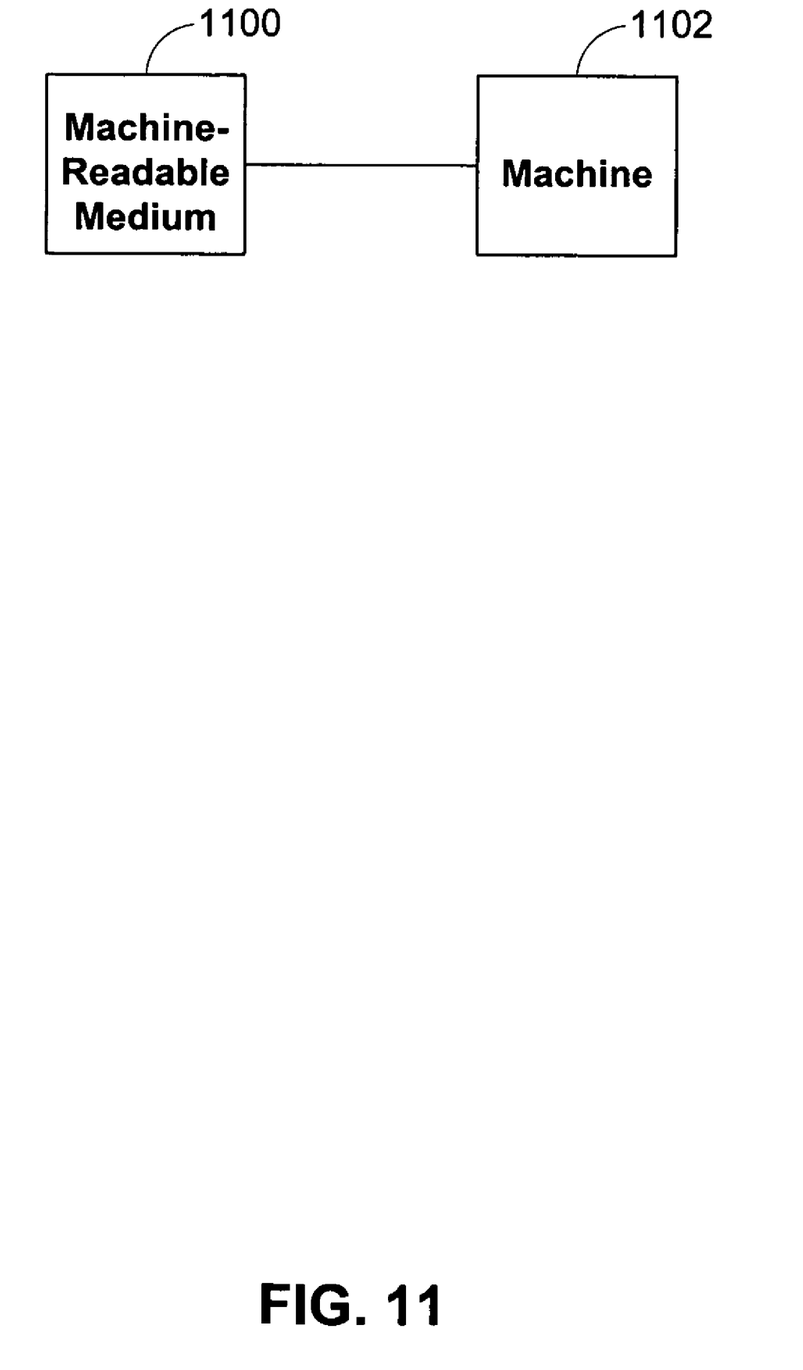
FIG. 11 is a schematic diagram of an illustrative machine-readable medium that may be encoded with machine-readable instructions for use in implementing a user logic design in a PLD.

FIG. 11 is a schematic diagram of an illustrative machine-readable medium that may be encoded with machine-readable instructions for use in implementing a user logic design in a PLD. Machine-readable medium 1100 may be encoded with instructions for carrying out the features described herein with respect to the user logic design to hardware application. Machine-readable medium 1100 may be, for example, magnetic disks (e.g., floppy disks, hard disk drives), optical disks (e.g., CD-ROM/R/RW, DVD -R/-RW/+R/+RW/RAM/ROM), EPROM, FLASH memory, a PLD, an ASIC device, any other suitable medium, or any combination thereof. Machine 1102 may be any suitable machine capable of reading machine-readable medium 1100, such as any suitable computer.

Thus, a hybrid multiplier implemented using DSP circuitry and programmable logic circuitry is provided. One skilled in the art will appreciate that the present invention can be practiced by other than the described embodiments, which are presented for purposes of illustration and not of limitation, and the present invention is limited only by the claims which follow.

What is claimed is:

1. A programmable logic device comprising:
   digital signal processing circuitry comprising at least one embedded multiplier of a particular size; and
   programmable logic circuitry, wherein a user logic design multiplier of a size greater than the particular size is implemented by a user logic design to hardware application using the at least one embedded multiplier and the programmable logic circuitry.

2. The programmable logic device of claim 1 wherein the particular size is a largest size available among all embedded multipliers in the programmable logic device that is still smaller than the size of the user logic design multiplier.

3. The programmable logic device of claim 1, wherein the user logic design multiplier is used to implement an infinite impulse response filter.

4. The programmable logic device of claim 1, wherein the user logic design multiplier is used to implement an finite impulse response filter.

5. A printed circuit board on which is mounted a programmable logic device as defined in claim 1.

6. The printed circuit board defined in claim 5 further comprising:
   a memory mounted on the printed circuit board and coupled to the programmable logic device.

7. The printed circuit board defined in claim 5 further comprising:
   processing circuitry mounted on the printed circuit board and coupled to the programmable logic device.

8. The programmable logic device of claim 1 wherein:
   the programmable logic circuitry is configured to implement at least one component multiplier; and
   the at least one component multiplier and the at least one embedded multiplier generate partial products, the sum of which is the product of the user logic design multiplier.

9. The programmable logic device of claim 8 wherein the at least one component multiplier comprises three component multipliers implemented using programmable logic circuitry.

10. The programmable logic device of claim 8 wherein the at least one component multiplier comprises two component multipliers implemented using programmable logic circuitry.

11. The programmable logic device of claim 8 wherein:
    the user logic design multiplier has a size that exceeds the particular size of the at least one embedded multiplier by one bit on one side of the at least one embedded multiplier; and
    the at least one component multiplier comprises a single component multiplier implemented using programmable logic circuitry.

12. The programmable logic device of claim 8 further comprising circuitry for generating the sum of partial products of the at least one component multiplier and the at least one embedded multiplier.

13. The programmable logic device of claim 8, further comprising bit shifting circuitry for shifting the output of one of the at least one component multiplier and the embedded multiplier.

14. The programmable logic device of claim 8, further comprising bit padding circuitry for padding the output of one of the at least one component multiplier and the embedded multiplier.

* * * * *